(12) United States Patent
Humphries et al.

(10) Patent No.: US 9,269,927 B2
(45) Date of Patent: Feb. 23, 2016

(54) METHOD AND COMPOUND

(71) Applicants: Cambridge Display Technology, Ltd., Cambridgeshire (GB); Sumitomo Chemical Company Limited, Tokyo (JP)

(72) Inventors: Martin Humphries, Cambridgeshire (GB); Florence Bourcet, Cambridgeshire (GB)

(73) Assignees: Cambridge Display Technology, Ltd., Godmanchester (GB); Sumitomo Chemical Company Limited, Tokyo (JP)

( * ) Notice: Subject to any disclaimer, the term of this patent is extended or adjusted under 35 U.S.C. 154(b) by 0 days.

(21) Appl. No.: 14/151,639

(22) Filed: Jan. 9, 2014

(65) Prior Publication Data
US 2014/0193937 A1    Jul. 10, 2014

(30) Foreign Application Priority Data

Jan. 9, 2013   (GB) .................................. 1300376.9

(51) Int. Cl.
H01L 21/00       (2006.01)
H01L 51/56       (2006.01)
H01L 51/00       (2006.01)
H01L 51/50       (2006.01)

(52) U.S. Cl.
CPC .............. H01L 51/56 (2013.01); H01L 51/006 (2013.01); H01L 51/0052 (2013.01); H01L 51/0054 (2013.01); H01L 51/0056 (2013.01); H01L 51/0059 (2013.01); H01L 51/0067 (2013.01); H01L 51/5088 (2013.01); H01L 51/5056 (2013.01)

(58) Field of Classification Search
CPC ........................... H01L 51/5088; H01L 51/56
USPC .......................................... 438/22, 34, 46, 99
See application file for complete search history.

(56) References Cited

U.S. PATENT DOCUMENTS

2003/0143341 A1   7/2003   Lee
2011/0177641 A1   7/2011   Cheon et al.

FOREIGN PATENT DOCUMENTS

WO     WO 86/01503 A1   3/1986
WO     WO 87/01383 A    3/1987
WO     WO 2012/003485 A2   1/2012

*Primary Examiner* — Julia Slutsker
(74) *Attorney, Agent, or Firm* — Wolf, Greenfield & Sacks, P.C.

(57) ABSTRACT

A method of forming a layer of an electronic device, for example an organic light-emitting device, the method comprising the step of depositing a precursor layer comprising a compound of formula (I) and reacting the compound of formula (I) in a ring-opening addition reaction:

Core-(Reactive Group)$_n$     (I)

wherein Core is a non-polymeric core group; and each Reactive Group, which may be the same or different in each occurrence, is a group of formula (II):

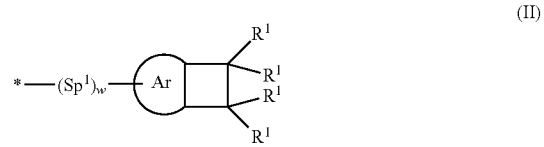

wherein $Sp^1$ independently in each occurrence represents a spacer group; w independently in each occurrence is 0 or 1; Ar in each occurrence independently represents an aryl or heteroaryl group; $R^1$ in each occurrence independently represents H or a substituent, with the proviso that at least one $R^1$ is a substituent; n is at least 1; and * is a point of attachment of the group of formula (II) to the Core; and wherein the compound of formula (I) reacts with itself or with a non-polymeric co-reactant.

16 Claims, 1 Drawing Sheet

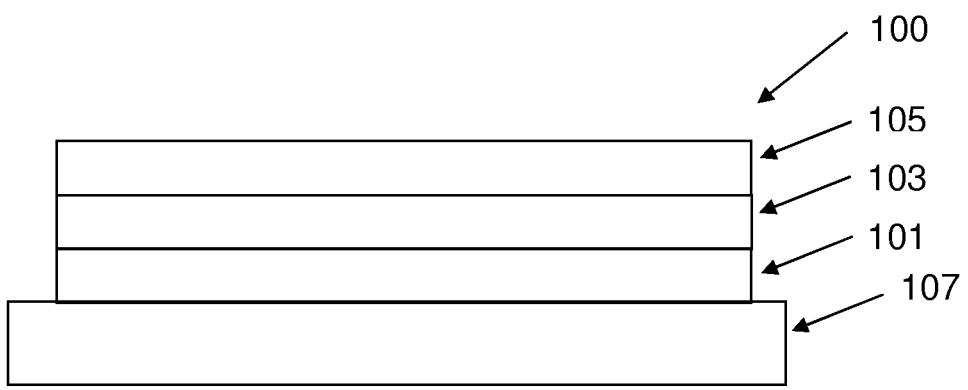

METHOD AND COMPOUND

RELATED APPLICATIONS

This application claims foreign priority benefits under 35 U.S.C. §119(a)-(d) or 35 U.S.C. §365(b) of British application number 1300376.9, filed Jan. 9, 2013, the entirety of which is herein incorporated by reference.

BACKGROUND

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED device may comprise a substrate carrying an anode, a cathode and one or more organic light-emitting layers between the anode and cathode.

Holes are injected into the OLED device through the anode and electrons are injected through the cathode during operation of the device. Holes in the highest occupied molecular orbital (HOMO) and electrons in the lowest unoccupied molecular orbital (LUMO) of a light-emitting material present within the OLED device combine to form an exciton that releases its energy as light.

Within an OLED device, the light-emitting material may be used as a dopant within a light emitting layer. The light-emitting layer may comprise a semiconducting host material and the light-emitting dopant, and energy will be transferred from the host material to the light-emitting dopant. For example, J. Appl. Phys. 65, 3610, 1989 discloses a host material doped with a fluorescent light-emitting dopant (that is, a light-emitting material in which light is emitted via decay of singlet excitons).

Formation of the one or more organic layers of an OLED may be by deposition of materials used to form those layers from a solution in a solvent followed by evaporation of the solvent. Examples of suitable solution processing methods include coating methods such as spin-coating or dip-coating and printing methods such as inkjet printing or roll-to-roll printing.

In devices comprising multiple organic layers, a first deposited organic layer may be rendered insoluble by crosslinking prior to deposition of a further organic layer by a solution processing method in order to prevent dissolution of the first deposited layer by the solvent used in formation by solution processing of the further organic layer.

WO 2005/049689 discloses polymers comprising fluorene repeat units substituted with crosslinkable groups, including a double bond, a triple bond, a precursor capable of in situ formation of a double bond or a heterocyclic, addition polymerisable group. Benzocyclobutane (BCB) is disclosed as an exemplary crosslinkable group.

WO 2010/013723 discloses polymers comprising double bond groups and BCB groups.

Mariet et al, Tetrahedron 60, 2004, 2829-2835 discloses calculated formation energies for formation of xylylenes from corresponding benzocyclobutanes.

WO2012003485 and WO2012003482 disclose hole-transporting layers formed by reaction of hole-transporting compounds substituted with benzocyclobutane.

SUMMARY OF THE INVENTION

In a first aspect the invention provides a method of forming a layer of an electronic device, the method comprising the step of depositing a precursor layer comprising a compound of formula (I) and reacting the compound of formula (I) in a ring-opening addition reaction:

wherein Core is a non-polymeric core group; and each Reactive Group, which may be the same or different in each occurrence, is a group of formula (II):

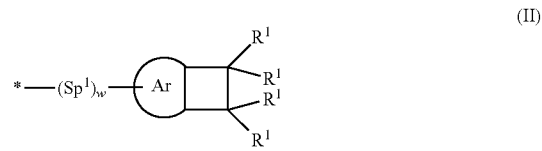

wherein:
$Sp^1$ independently in each occurrence represents a spacer group;
w independently in each occurrence is 0 or 1;
Ar in each occurrence independently represents an aryl or heteroaryl group that is unsubstituted or substituted with one or more substituents;
$R^1$ in each occurrence independently represents H or a substituent, with the proviso that at least one $R^1$ is a substituent;
n is at least 1; and
* is a point of attachment of the group of formula (II) to Core;
and wherein the compound of formula (I) reacts with itself or with a non-polymeric co-reactant.

DESCRIPTION OF THE DRAWINGS

The invention will now be described in more detail with reference to the drawings in which:

FIG. 1 illustrates an OLED according to an embodiment of the invention.

DETAILED DESCRIPTION OF THE INVENTION

FIG. 1, which is not drawn to any scale, illustrates schematically an OLED 100 according to an embodiment of the invention. The OLED 100 is carried on substrate 107 and comprises an anode 101, a cathode 105 and a light-emitting layer 103 between the anode and the cathode. Further layers (not shown) may be provided between the anode and the cathode including, without limitation, charge-transporting layers, charge-blocking layers, charge injection layers and exciton-blocking layers. The light-emitting layer may contain one or more light-emitting materials. The light-emitting layer may contain fluorescent and/or phosphorescent light-emitting materials. The light-emitting material or materials of the a light-emitting layer may be small molecule, polymeric or dendrimeric light-emitting materials. The device may contain more than one light-emitting layer.

Exemplary OLED structures including one or more further layers include the following:
Anode/Hole-injection layer/Light-emitting layer/Cathode
Anode/Hole transporting layer/Light-emitting layer/Cathode Anode/Hole-injection layer/Hole-transporting layer/Light-emitting layer/Cathode Anode/Hole-injection layer/Hole-transporting layer/Light-emitting layer/Electron-transporting layer/Cathode.

A compound of formula (I) may be used in formation of one or more of a light-emitting layer, a hole-transporting layer, an electron-transporting layer, a hole-blocking layer, an electron-blocking layer or an exciton blocking layer. The Core of the compound of formula (I) may be selected according to the required functionality of the layer that the compound of formula (I) is used to form.

A layer formed by reaction of a compound of formula (I) may consist essentially of the reaction product of the compound of formula (I), either reacted with itself or reacted with the non-polymeric co-reactant, or may contain one or more further materials. Preferably, the composition used to form a layer containing a compound of formula (I) is substantially free of polymeric materials that are capable of reacting with the compound of formula (I) in a ring-opening reaction. A layer containing the compound of formula (I) may be substantially free of any polymer.

In a preferred arrangement, a compound of formula (I) is used in forming a hole-transporting layer provided between the anode and the light-emitting layer or layers. Light-emitting materials for use in the light-emitting layer or layers in this case include small molecule, polymeric and dendrimeric light-emitting materials, and mixtures thereof. Polymers for use in the light-emitting layer include conjugated and non-conjugated polymers. Polymers of the light-emitting layer may comprise one or more repeat units selected from arylene repeat units, for example fluorene repeat units or phenylene repeat units; and arylamine repeat units. The light-emitting layer may contain a single material, for example a light-emitting polymer, or it may contain two or more materials, for example a host material and a light-emitting dopant. Exemplary phosphorescent light-emitting materials include transition metal complexes of iridium, platinum, palladium, ruthenium and rhodium.

In another preferred arrangement, a compound of formula (I) is used in forming a light-emitting layer. In this arrangement, the light-emitting layer may further comprise a light-emitting dopant, optionally a phosphorescent transition metal complex, and the material produced by reaction of the compound of formula (I) may function as a host material.

Each of these layers may be formed by depositing a layer containing a compound of formula (I) and reacting the compound of formula (I) in the deposited layer. A compound of formula (I) may be deposited from a formulation comprising the compound dissolved in at least one solvent, followed by evaporation of the at least one solvent to leave a layer comprising the compound of formula (I). Any solution processing method may be used to deposit a layer comprising a compound of formula (I), including coating and printing methods.

Reaction of a layer containing the compound of formula (I) may result in a lowering of solubility of the layer, particularly if the reaction produces a high molecular weight product, for example a polymer. Further layers may then be deposited on top of the reacted layer using solution processing methods. The reduction in solubility may be measured by determining the solubility of a layer of the compound of formula (I) in a solvent or solvent mixture, as compared to the solubility of the layer following reaction of the compound of formula (I). Solubility may be measured by measuring the thickness of a layer before and after washing with a solvent or solvent mixture.

Compounds of Formula (I)

Compounds of formula (I) are non-polymeric. "Non-polymeric" compounds as described anywhere herein may include compounds having no polydispersity and/or compounds with a molecular weight of less than 5,000 Daltons or less than 3,000 Daltons.

Compounds of formula (I) contain a Core with one or more reactive groups of formula (II) attached thereto. Optionally, n of formula (I) is 1, 2, 3, 4, 5, 6, 7, 8, 9 or 10.

The reactive group of formula (II) contains a cyclobutane ring substituted with at least one substituent $R^1$.

Optionally, at least one $R^1$ is selected from the group consisting of linear or branched $C_{1-20}$ alkyl; $C_{1-20}$ alkoxy; aryl or heteroaryl, for example phenyl, that is unsubstituted or substituted with one or more substituents, for example one or more substituents selected from $C_{1-10}$ alkyl groups, $C_{1-10}$ fluoroalkyl groups and fluorine; and substituted silicon, for example tri(hydrocarbyl)silyl wherein hydrocarbyl is optionally in each occurrence selected from $C_{1-10}$ alkyl, unsubstituted phenyl and phenyl substituted with one or more $C_{1-10}$ alkyl groups. Preferably, at least one $R^1$ is selected from the group consisting of linear or branched $C_{1-20}$ alkyl or $C_{1-20}$ alkoxy.

Optionally, at least one group of formula (II) carries only one $R^1$ substituent group.

Optionally, Ar is phenyl that may be unsubstituted or substituted with one or more substituents. Optionally, substituents are selected from $C_{1-20}$ alkyl wherein one or more non-adjacent C atoms may be replaced by O, S, CO or COO and one or more H atoms may be replaced with F.

Exemplary spacer groups $Sp^1$ include:

optionally substituted aryl or heteroaryl groups, for example phenyl groups optionally substituted with one or more $C_{1-10}$ alkyl groups; and a $C_{1-20}$ n-alkyl chain wherein one or more non-adjacent C atoms of the n-alkyl chain may be replaced with optionally substituted aryl or heteroaryl, O, S, substituted N, substituted Si—C═O and —COO—, and one or more H atoms of the n-alkyl chain may be replaced with $C_{1-5}$ alkyl, F or an aryl or heteroaryl group. Exemplary substituents for substituted N and substituted Si include $C_{1-10}$ alkyl. Where a C atom is replaced with an aryl or heteroaryl group, the aryl or heteroaryl group is preferably phenyl optionally substituted with one or more $C_{1-10}$ alkyl groups.

Preferred spacer groups are selected from $C_{1-30}$ hydrocarbyl groups, for example branched or linear $C_{1-20}$ alkyl and phenyl-$C_{1-20}$ alkyl. Optionally, the spacer group comprises at least 2 or at least 3 aliphatic carbon atoms.

Exemplary Cores of compounds of formula (I) include amines; aromatic or heteroaromatic groups that may be unsubstituted or substituted with one or more substituents; $C_{1-10}$ alkane, optionally a carbon atom; and cationic or anionic groups.

In one embodiment, Core may be a functional group such as a hole-transporting group, electron-transporting group, exciton-blocking group or dopant group that is substituted with one or more reactive groups.

In another embodiment, Core of compounds of formula (I) may simply be a linking group, such as a $C_{1-40}$ hydrocarbyl group, for example a carbon atom, a phenyl group or a tetraphenylmethane group, that links two or more reactive groups. In this case, a functional group may be provided as the core of a co-reactant, as described in more detail below.

A compound of formula (I) having an exciton-blocking Core may be used in an exciton-blocking layer and may have a lowest excited singlet state $S_1$ or lowest excited triplet state $T_1$ that is higher than that of a light-emitting material of a light-emitting layer that the Core is used with.

Exemplary hole-transporting compounds may have a highest occupied molecular orbital (HOMO) level that is the same as or more negative than that of the light-emitting material that the compound is to be used with. A hole-transporting compound may have a HOMO level greater than (i.e. further from vacuum level than) 5.0 eV, greater than 5.1 eV or greater than 5.3 eV.

Exemplary electron-transporting compounds may have a lowest unoccupied molecular orbital (LUMO) level that is the same as or less negative than that of the light-emitting material that the compound is to be used with. An electron-transporting compound may have a LUMO level of up to (i.e. no further from vacuum level than) 3 eV.

HOMO and LUMO levels may be measured by square wave cyclic voltammetry. Aromatic or heteroaromatic Core groups include phenyl and fused aryl groups, each of which may be unsubstituted or substituted with one or more substituents (other than groups of formula II). Exemplary substituents for aryl or heteroaryl Cores include $C_{1-60}$ hydrocarbyl groups, for example $C_{1-20}$ alkyl; unsubstituted phenyl; and phenyl substituted with one or more $C_{1-20}$ alkyl groups.

The Core may comprise an amine. Amines may provide hole-transporting functionality, and compounds containing an amine Core may be used in a hole-transporting or light-emitting layer of an OLED.

The Core may be a group of formula (III):

(III)

wherein:
$Ar^1$ in each occurrence independently represents an aryl or heteroaryl group that is unsubstituted or substituted with one or more substituents;
$Ar^3$ in each occurrence independently represents an aryl or heteroaryl group that is unsubstituted or substituted with one or more substituents;
$R^8$ in each occurrence independently represent represents a substituent, and $R^8$ and $Ar^3$ directly attached to the same N atom may be linked to form a ring;
x is a positive integer, optionally 1, 2 or 3;
y in each occurrence is independently 0 or a positive integer, optionally 1 or 2;
m in each occurrence is a positive integer, optionally 1 or 2;
and wherein the or each group of formula (II) is independently in each occurrence bound to one of: $Ar^1$; $Ar^3$ in the case where y is a positive integer; and N in the case where y is 0.

If x is greater than 1 then each N atom is separated by —$(Ar^3)_y$— wherein y is an integer.

Optionally, $Ar^3$ in each occurrence is phenyl or fused aryl that may be unsubstituted or substituted with one or more substituents.

Exemplary substituents for $Ar^3$ include:
$C_{1-20}$ alkyl wherein one or more non-adjacent C atoms of the alkyl group may be replaced with O, S, COO or CO and one or more H atoms may be replaced with F; and
groups of formula (II).

Optionally, $R^8$ in each occurrence may independently be selected from $C_{1-60}$ hydrocarbyl.

Optionally, at least one $R^8$ is a group of formula (II).

Optionally, $R^8$ in each occurrence is independently selected from an aryl or heteroaryl group $Ar^2$, optionally phenyl, that may be unsubstituted or substituted with one or more substituents. Optionally, substituents of $Ar^2$ are selected from $C_{1-40}$ hydrocarbyl, optionally $C_{1-20}$ alkyl.

In one optional arrangement, $Ar^1$ is phenyl that may be unsubstituted or substituted with one or more substituents.

In another optional arrangement, $Ar^1$ is a fused aryl or heteroaryl group that may be unsubstituted or substituted with one or more substituents.

Exemplary fused aryl groups $Ar^1$ include groups of formulae (IV)-(IX), each of which may be unsubstituted or substituted with one or more substituents:

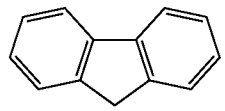
(IV)

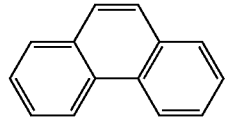
(V)

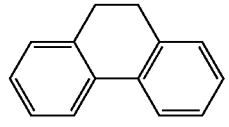
(VI)

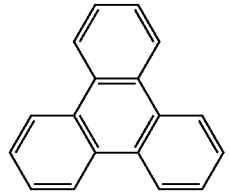
(VII)

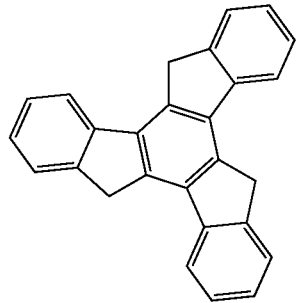
(VIII)

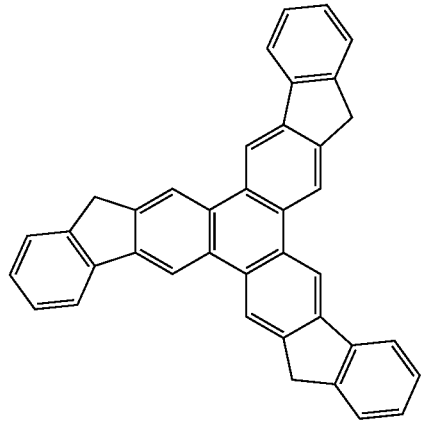
(IX)

Where present, substituents of $Ar^1$ may be selected from substituents $R^9$ selected from:

C$_{1-60}$ hydrocarbyl

C$_{1-20}$ alkyl wherein one or more non-adjacent C atoms of the alkyl group may be replaced with O, S, COO or CO and one or more H atoms may be replaced with F; and groups of formula (II).

Substituents R$^9$ other than groups of formula (II), for example C$_{1-20}$ alkyl, may enhance solubility of the compound of formula (I).

Substituents may be provided on aromatic carbon atoms or, where present on non-aromatic (sp$^3$-hybridised) ring carbon atoms of Ar$^1$. Optionally, non-aromatic ring carbon atoms of units (IV)-(IX) are substituted with one or two substituents R$^9$.

In the case where y is a positive integer, Ar$^3$ may be substituted with at least one group of formula (II). In this case, the compound of formula (I) may have formula (Ia):

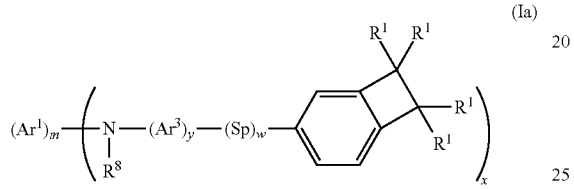

(Ia)

In the case where y=0, a group of formula (II) may be attached to N, as illustrated in the compound of formula (Ib):

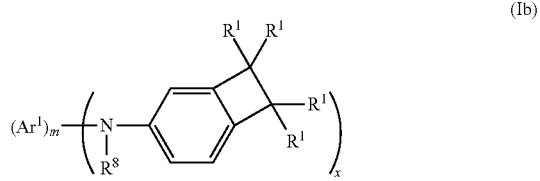

(Ib)

In compounds of formulae (Ia) and (Ib), n may be the same as x.

The compound of formula (I) may have formula (Ic), in which n=1, although in other embodiments a compound of formula (I) have formula (Ic) wherein n may be greater than 1:

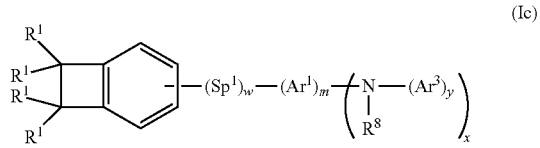

(Ic)

In further embodiments, both Ar$^1$ and one or both of N and Ar$^3$ are substituted with a group of formula (II).

In another embodiment the compound of formula (I) may be an ionic compound and Core may be a cation or anion. Optionally, Core comprises a carbocation. Optionally, the compound of formula (I) is an optionally substituted compound of formula (Id):

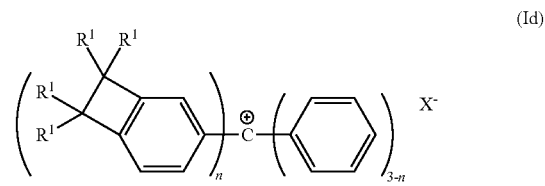

(Id)

wherein X$^-$ is an anion. Exemplary anions are borates, for example borates of formula B(Ar$^7$)$_4$—, wherein Ar$^7$ in each occurrence is independently selected from aryl and heteroaryl and wherein each Ar$^7$ is independently unsubstituted or substituted with one or more substituents. Exemplary groups Ar$^7$ include unsubstituted phenyl and phenyl substituted with one or more alkyl, fluorine or fluoroalkyl groups. Specific examples of borates are B(C$_6$F$_5$)$_4$ and B(3,5-(CF$_3$)$_2$C$_6$H$_3$)$_4$.

Optional substituents for compounds of formula (Id) may be selected from C$_{1-20}$ alkyl wherein one or more non-adjacent C atoms may be replaced by O, S, CO or COO and one or more H atoms may be replaced with F.

Ionic compounds of formula (I) may be used as dopants that are reacted with other components of the layer in which the compound of formula (I) is to be used.

Exemplary heteroaryl-containing Core groups are triazine and triphenyltriazine.

Exemplary compounds of formula (I) are illustrated below, wherein each R$^1$ is a substituent. The compounds below illustrate a specific substitution position of R$^1$ on the cyclobutane ring of the group of formula (II), however it will be appreciated that the substituent R$^1$ may be provided at either position on the cyclobutane ring. Synthesis and use of compounds of formula (I) may include synthesis and use of a single isomer in which R$^1$ is at a single position on the cyclobutane ring, or isomer mixtures.

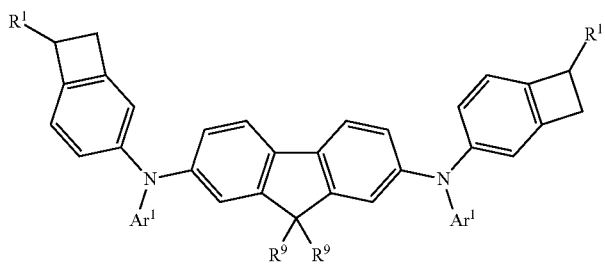

-continued
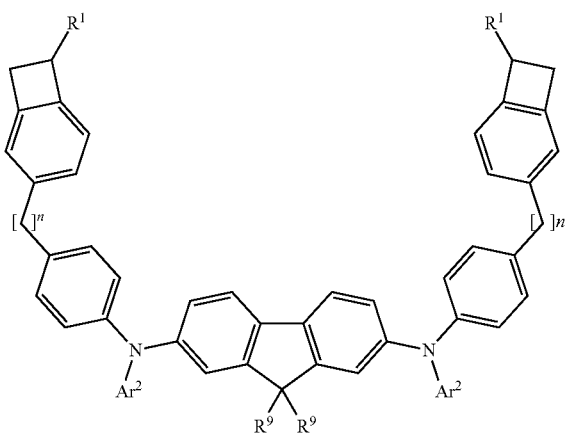
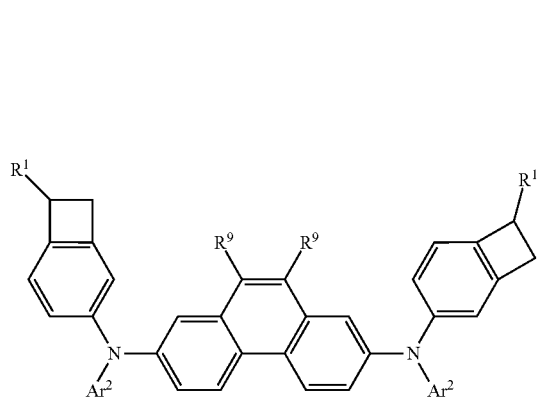
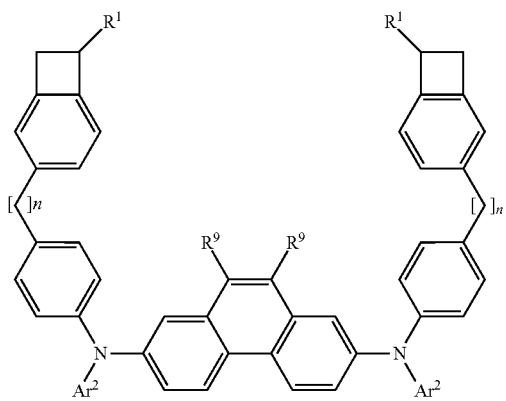
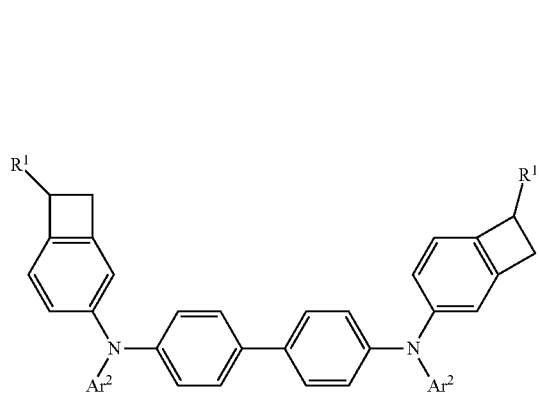
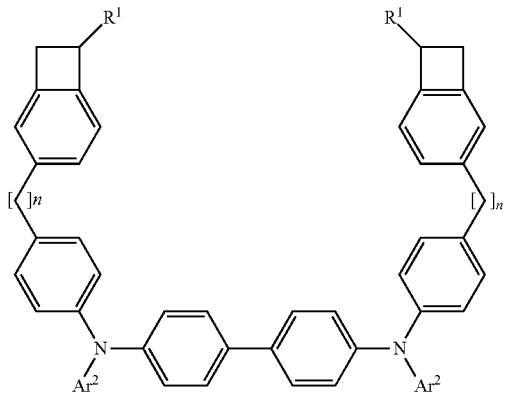
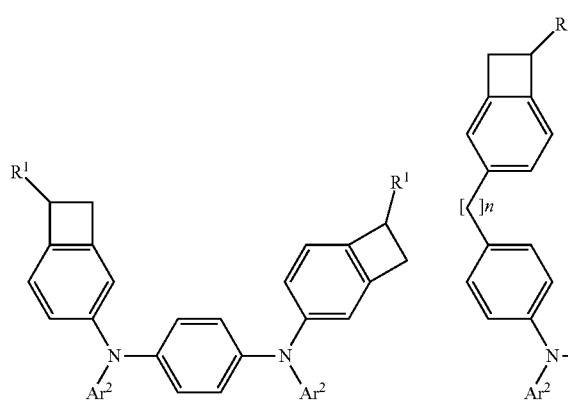
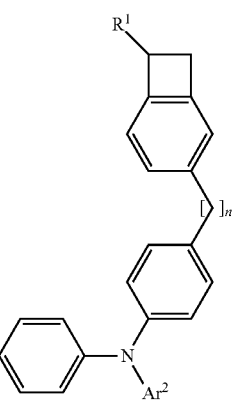

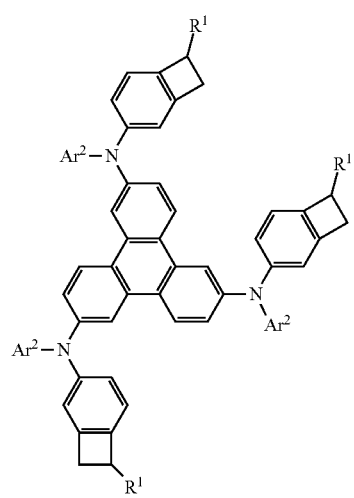
-continued
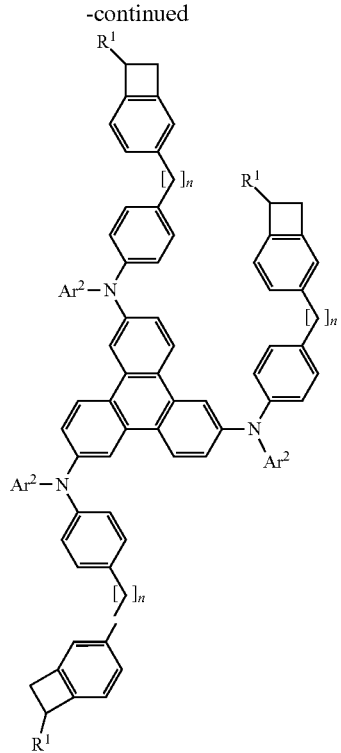
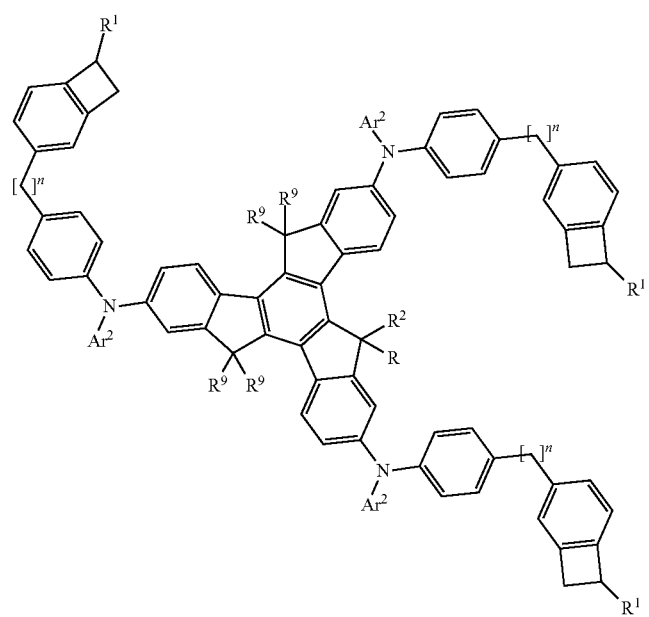

-continued
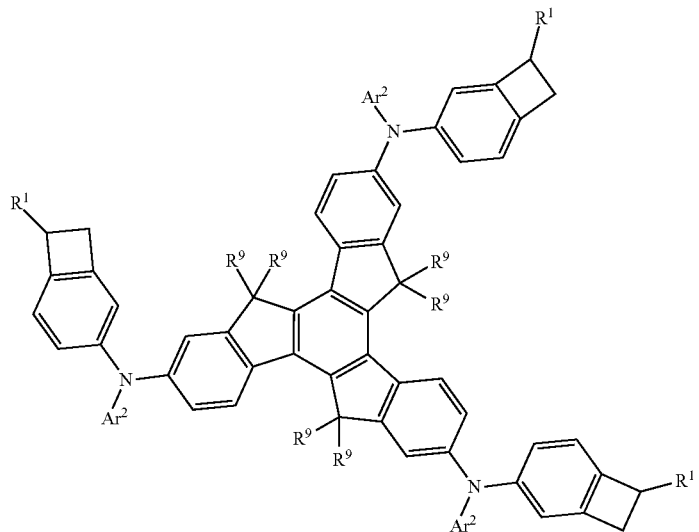
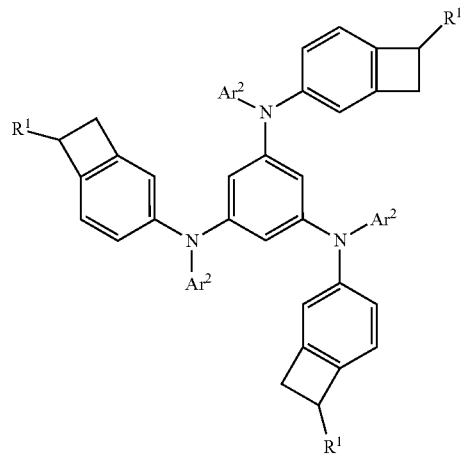
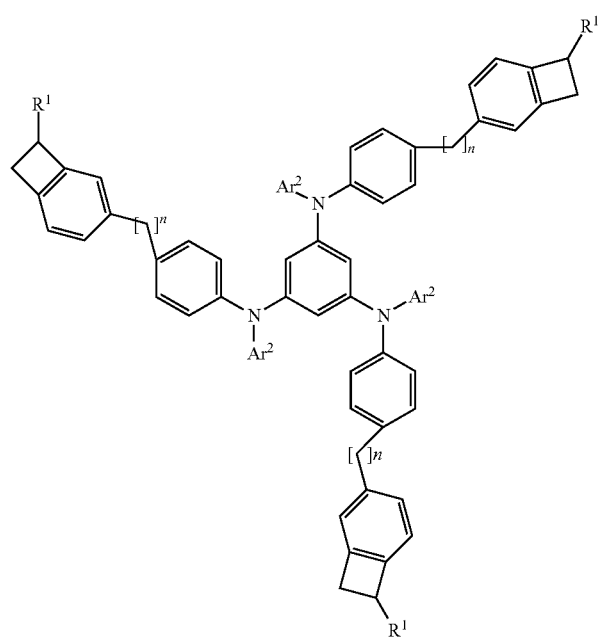
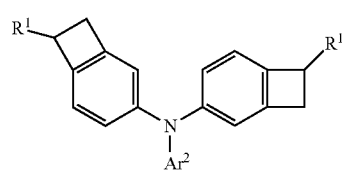
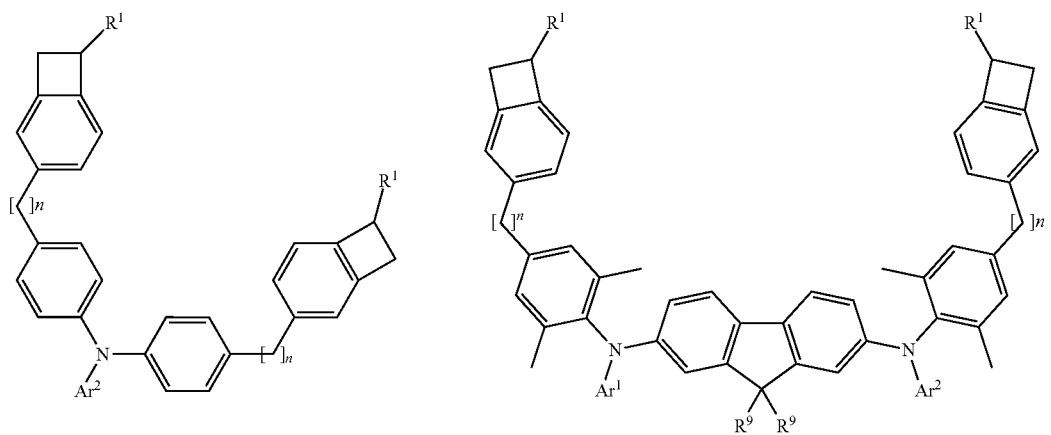

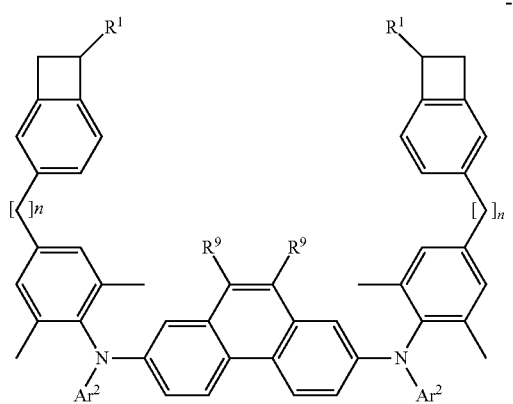
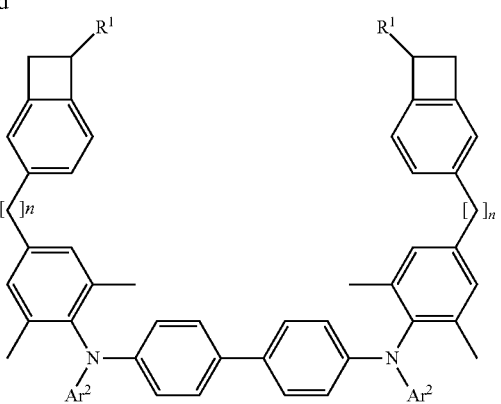
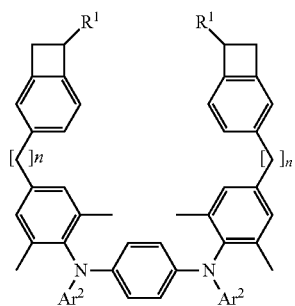
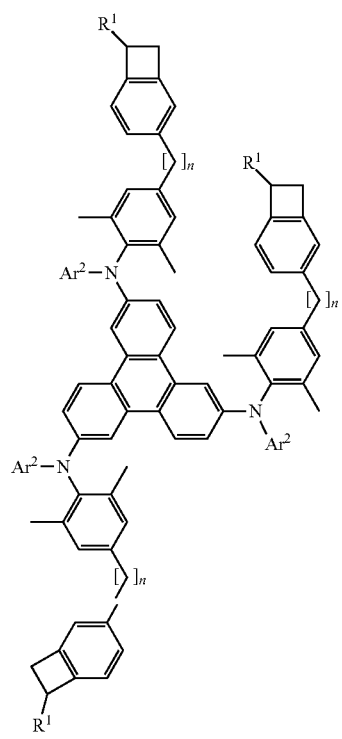

-continued
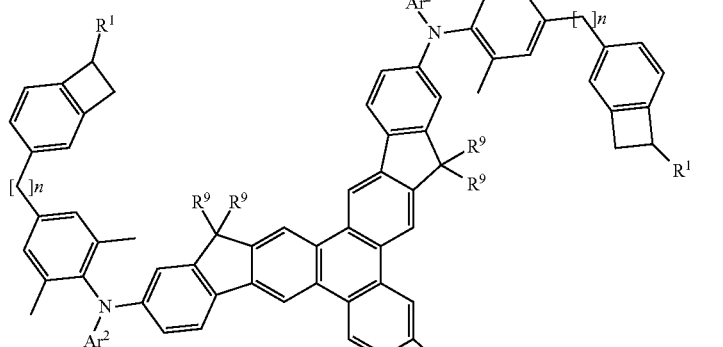
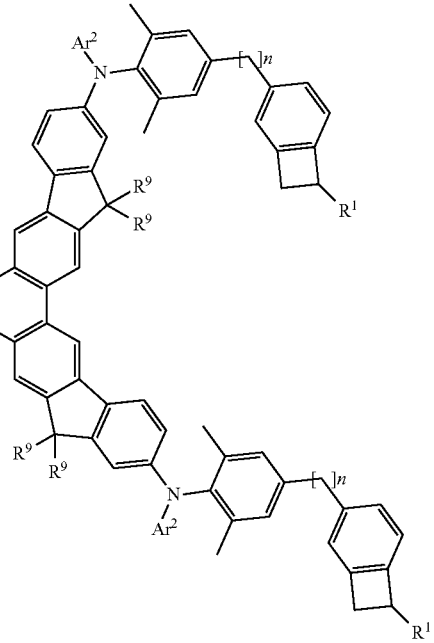
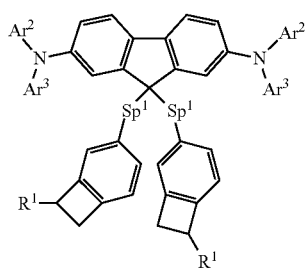
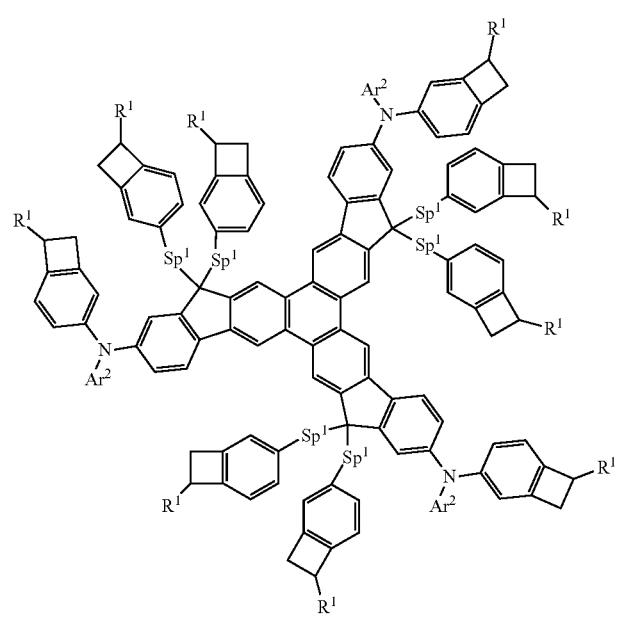

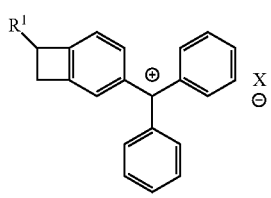
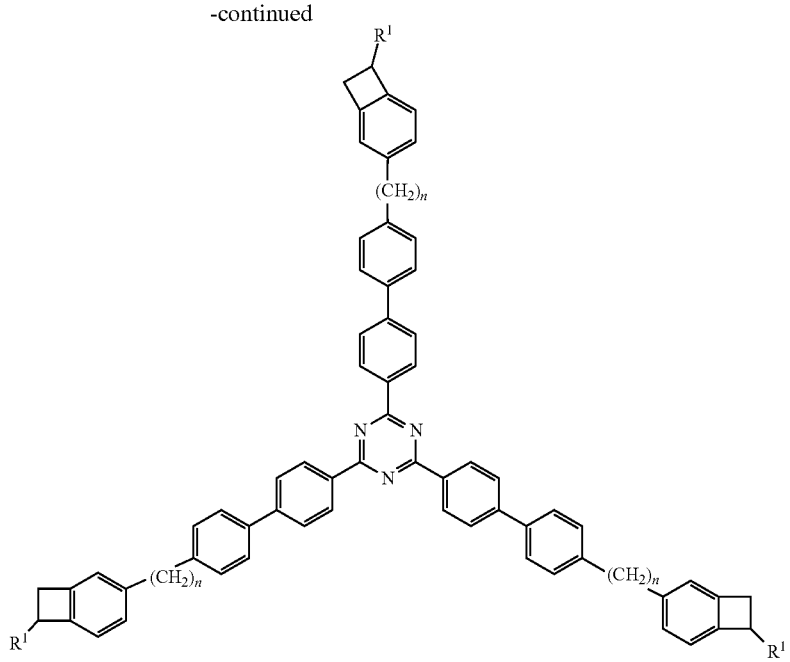
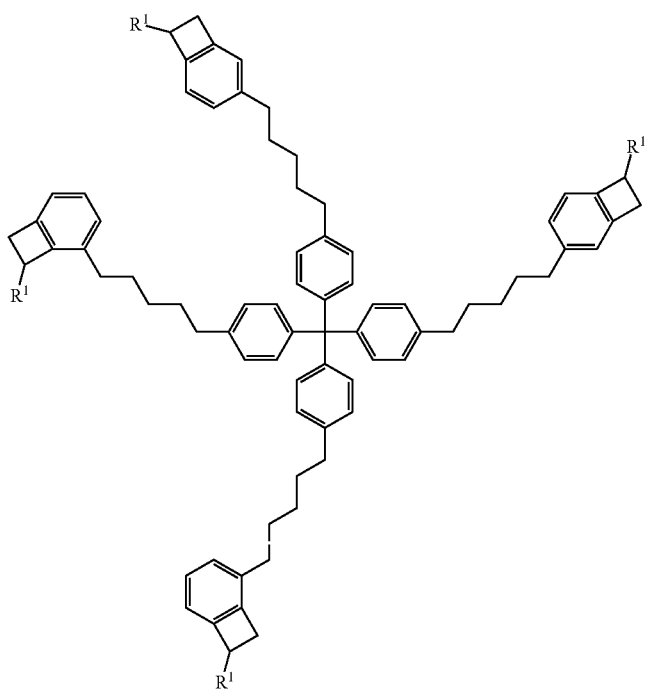
wherein n of the spacer chain is from 1-10.

Reaction of Compounds of Formula (I)

Compounds of formula (I) react by a ring-opening reaction in which the cyclobutane ring(s) of compounds of formula (I) react with one another and/or with a co-reactant.

In one embodiment, a layer containing a compound of formula (I) may be reacted with itself as illustrated in Scheme 1 below (only 1 possible isomer is shown for simplicity):

Scheme 1

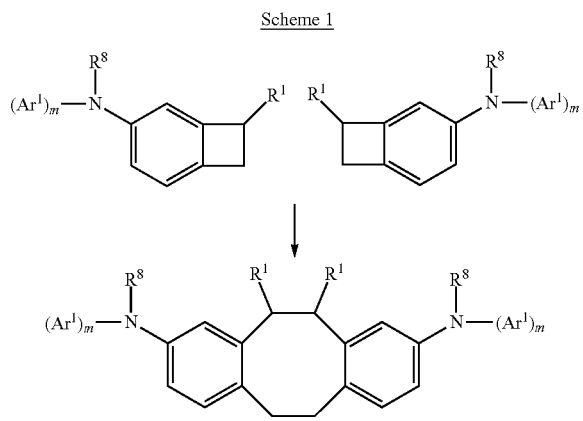

The compounds of formula (I) that are reacted together may be the same or different.

In another embodiment, the compound of formula (I) may be reacted with a co-reactant. The co-reactant may be a dienophile. The co-reactant may be a compound of formula (X):

wherein:

Core, $Sp^1$ and w are as described above;

$R^7$ is H or a substituent;

$R^6$ is H or a substituent; and q is at least 1, optionally 1, 2, 3 or 4.

Optionally, $R^6$ and $R^7$ are each independently selected from H and $C_{1-20}$ hydrocarbyl, optionally H and $C_{1-20}$ alkyl. Optionally, at least one $R^6$ is H.

A compound of formula (I) and a compound of formula (X) may react as illustrated in Scheme 2 (only 1 possible isomer is shown for simplicity):

Scheme 2

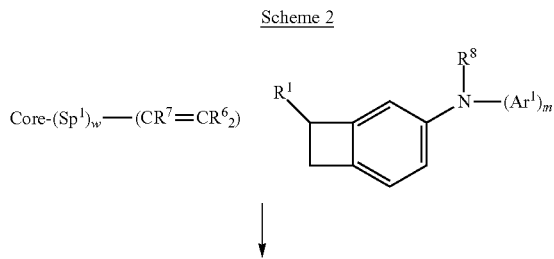

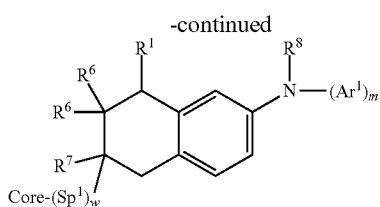

-continued

If a co-reactant is reacted with a compound of formula (I) then it will be appreciated that reaction may take place between molecules of formula (I) in competition with reaction between molecules of formula (I) and molecules of the co-reactant.

The number of reactive groups of formula (I) and, if present, the number of reactive groups of co-repeat units, will affect the structure of the product.

Reaction between compounds having only one reactive group will result in formation of an adduct of the two compounds.

Reaction between compounds containing two reactive groups may form a straight-chain polymer. A straight-chain polymer may be produced by reaction between a compound of formula (I) containing two reactive groups of formula (II), optionally in the presence of a co-reactant containing two reactive groups.

If the compound of formula (I) contains more than two groups of formula (II), and/or if a co-reactant contains more than two reactive groups, then reaction may result in formation of a branched polymer.

It will be appreciated that the extent of branching in the product formed by reacting compounds of formula (I) will depend on the proportion of reactants having at least three reactive groups (for example three or four reactive groups). Optionally, at least 2 mol % or at least 5 mol % of reactive compounds (including compounds of formula (I) and, if present, co-reactants) contain at least three reactive groups. Optionally up to 100% of reactive compounds used to form the reacted layer may contain at least three reactive groups.

Reactive compounds that may be used in order to form a branched product, include: compounds of formula (I) wherein n is at least 3; and co-reactants with at least 3 reactive groups used in combination with compounds of formula (I) wherein n may be at least 2.

The extent of branching may affect solubility of the layer formed by reacting compounds of formula (I), and the proportion of reactive compounds containing at least 3 reactive groups may be selected in order to obtain a reacted layer that is less soluble, and that may be completely insoluble, as compared to the solubility of a layer containing the reactive compounds before reaction.

The present inventors have found that the presence of substituent $R^1$ on the cyclobutane ring of the group of formula (II) may reduce the reaction temperature required for curing a layer of the compound of formula (I) as compared to the case where all $R^1$ groups are H Compounds of formula (I) may be reacted by, for example, thermal treatment and/or exposure to light (e.g. UV light) having a wavelength and intensity for reaction. Thermal treatment may be at a temperature up to about 180° C., optionally up to about 160° C., optionally up to about 140° C. or 120° C., optionally up to 100° C. The treatment time may be up to about 60 minutes. The treatment time may depend on the treatment temperature. For example, a treatment at a temperature above 180° C. may be suitable if conducted for less than about 10 minutes.

The number, substitution position and identity of substituents $R^1$ in a compound of formula (I) may be selected according to the effect that the substituent has on the reactivity of the group of formula (II). For example, a substituent $R^1$ such as alkoxy, may cause a large increase in reactivity, enabling very low temperature reaction (e.g. <100° C.).

The high reactivity of compounds of formula (I) may allow for formation of a layer from compounds of formula (I) using a substrate that does not allow high temperature processing, for example a plastic substrate that is damaged at high temperatures. The high reactivity of compounds of formula (I) may also allow for faster reaction, reducing manufacture time of a device.

Applications

Compounds of formula (I) may be used to form reacted layers on a surface. A layer comprising a compound of formula (I) may be deposited on a surface and reacted to form a reacted layer.

A layer comprising a compound of formula (I) may be formed by depositing a solution comprising the compound of formula (I) dissolved in at least one solvent onto the surface, and evaporating the at least one solvent.

The reacted layer may form a layer of an organic electronic device, for example an organic light-emitting device. The surface that the compound of formula (I) is deposited onto depends on the function of the reacted layer and the structure of the final device. For example, the compound of formula (I) may be deposited onto an anode layer or a hole-injection layer if it is to be used to form a hole transporting layer, and it may be deposited onto a hole-transporting layer, an anode layer or a hole injection layer if it is to be used to form a light-emitting layer.

The reacted layer may form a hole-transporting layer between the anode and a light-emitting layer of the organic light-emitting device.

The reacted layer may form a light-emitting layer comprising a light-emitting dopant.

A layer consisting essentially of a compound of formula (I) may be reacted to form a layer of an organic electronic device.

A layer containing a compound of formula (I) and one or more co-reactants may be used to form a layer of an organic electronic device.

A layer containing a compound of formula (I), optionally with one or more co-reactants, may also contain one or more further compounds that do not react. For example, a light-emitting layer may be formed by depositing a layer containing a compound of formula (I), with or without one or more co-reactants, and one or more fluorescent or phosphorescent light-emitting dopants.

Hole Injection Layer

A conductive hole injection layer, which may be formed from a conductive organic or inorganic material, may be provided between the anode and the light-emitting layer or layers of an OLED to improve hole injection from the anode into the layer or layers of semiconducting polymer. If a hole-transporting layer is present between the anode and the light-emitting layer then the hole-injection layer may be provided between the anode and the hole-transporting layer. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx, MoOx and RuOx as disclosed in Journal of Physics D: Applied Physics (1996), 29(11), 2750-2753.

Cathode

The cathode of an OLED is selected from materials that have a workfunction allowing injection of electrons into the light-emitting layer. Other factors influence the selection of the cathode such as the possibility of adverse interactions between the cathode and the light-emitting material. The cathode may consist of a single material such as a layer of aluminium. Alternatively, it may comprise a plurality of metals, for example a bilayer of a low workfunction material and a high workfunction material such as calcium and aluminium as disclosed in WO 98/10621. The cathode may contain a layer of elemental barium as disclosed in WO 98/57381, Appl. Phys. Lett. 2002, 81(4), 634 and WO 02/84759. The cathode may contain a thin layer (e.g. about 1-5 nm) of metal compound between the light-emitting layer(s) of the OLED and one or more conductive cathode layers, for example one or more metal layers, to assist electron injection. Metal compounds include, in particular, an oxide or fluoride of an alkali or alkali earth metal, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

A compound of formula (I) may be dispersed or dissolved in a solvent or mixture of two or more solvents to form a formulation that may be used to form a layer containing the compound by depositing the formulation and evaporating the solvent or solvents. The formulation may contain one or more further materials in addition to a compound of formula (I), for example the formulation may contain a co-reactant. All of the components of the formulation may be dissolved in the solvent or solvent mixture, in which case the formulation is a solution, or one or more components may be dispersed in the solvent or solvent mixture. Exemplary solvents for use alone or in a solvent mixture include aromatic compounds, preferably benzene, that may be unsubstituted or substituted with one or more substituents selected from $C_{1-10}$ alkyl, $C_{1-10}$ alkoxy and halogens preferably chlorine, for example toluene, xylene or anisole.

Techniques for forming layers from a formulation include printing and coating techniques such spin-coating, dip-coating, flexographic printing, gravure printing, screen printing and inkjet printing.

Multiple organic layers of an OLED may be formed by deposition of formulations containing the active materials for each layer. Reaction of a layer comprising a compound of formula (I) may render the layer substantially insoluble in a solvent or solvent mixture used to deposit an overlying layer.

Coating methods such as spin-coating are particularly suitable for devices wherein patterning of the light-emitting layer is unnecessary—for example for lighting applications or simple monochrome segmented displays.

Printing methods such as inkjet printing are particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

The invention will now be described by means of example only by reference to the following Examples.

EXAMPLES

3-Bromo-7-methyl-bicyclo[4.2.0]octa-1,3,5-triene

Methyl-substituted benzocyclobutane was prepared according to the following method:

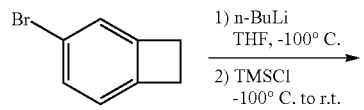

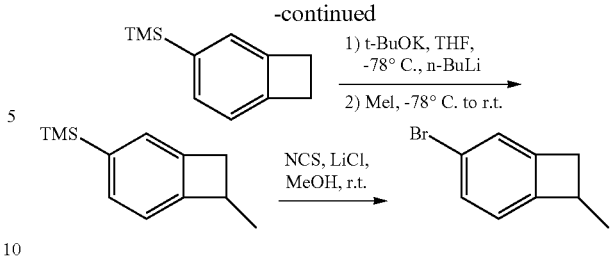

3-Trimethylsilylbicyclo[4.2.0]octa-1,3,5-triene

To a solution of 3-bromobicyclo[4.2.0]octa-1,3,5-triene (50.0 g, 0.27 mol) in THF (500 ml) at −100° C., was added n-BuLi (2.5M, 115 ml, 0.29 mol) drop wise such as to maintain the internal temperature below −95° C. The mixture was stirred for 3 hrs at −100° C. and trimethyl silyl chloride (36.7 ml, 0.29 mol) was added drop wise to it such as to maintain the internal temperature below −95° C. The mixture was allowed to warm up to room temperature over night.

The reaction mixture was cooled to 0° C., quenched with $H_2O$ (200 ml) and concentrated under reduced pressure. The residue was extracted with hexane (3×200 ml), the combined organic extracts were washed with $H_2O$ (3×200 ml), dried over $MgSO_4$ and concentrated under reduce pressure to yield 3-trimethylsilylbicyclo[4.2.0]octa-1,3,5-triene as an orange oil (56 g, GC-MS: $M^+$=176), which was used without further purification in the next step.

7-Methyl-3-trimethylsilylbicyclo[4.2.0]octa-1,3,5-triene

To a solution of t-BuOK (45.9 g, 0.41 mol) in THF (1000 ml) at −74° C. was added 3-trimethylsilylbicyclo[4.2.0]octa-1,3,5-triene (48.2 g, 0.27 mol), followed by n-BuLi (164 ml, 0.41 mol) and the resulting solution was stirred for 1 hr at −74° C. Methyl iodide (50.2 ml, 0.30 mol) was then added drop wise to the solution and the reaction mixture was allowed to warm up to room temperature overnight.

The reaction mixture was cooled to 0° C., quenched with an aqueous solution of $NH_4Cl$ (400 ml, 10% w/v) and concentrated under reduced pressure. The residue was extracted with hexane (3×200 ml), the combined organic extracts were washed with $H_2O$ (3×200 ml), dried over $MgSO_4$ and concentrated under reduce pressure to give an orange oil. The oil was filtered through a plug (silica, hexane) to yield 48.1 g of 7-methyl-3-trimethylsilylbicyclo[4.2.0]octa-1,3,5-triene as a colourless oil (48.1 g, GC-MS: $M^+$=190, 92.8% yield, isolated as a mixture of isomers).

3-Bromo-7-methyl-bicyclo[4.2.0]octa-1,3,5-triene

To a solution of 7-methyl-3-trimethylsilylbicyclo[4.2.0] octa-1,3,5-triene (48.1 g, 0.25 mol) in MeOH (1000 ml) at 25° C., was added N-chlorosuccinimide (37.1 g, 0.28 mol), followed by lithium bromide (24.1 g, 0.28 mol) and the reaction mixture was allowed to stir at this temperature for 2 hrs. It was then quenched with $H_2O$ (200 ml), and concentrated under reduced pressure. The residue was extracted with hexane (200 ml×4), the combined organic extracts were washed with H2O (3×200 ml), dried over $MgSO_4$ and concentrated under reduce pressure to give a pale yellow oil. The oil was purified by column chromatography (silica, hexane) to give the desired product 3-bromo-7-methyl-bicyclo[4.2.0]octa-1,3,5- triene as a colourless oil (42.6 g, GC-MS: M$^+$=196, M$^-$=198, isolated as a mixture of isomers).

$^1$H NMR (600 MHz, CDCl$_3$): δ=1.37 (d, J=7.1 Hz, 3H), 2.68 (d, J=14.2 Hz, 1H), 3.36 (dd, J=14.1 Hz, 5.2 Hz, 1H), 3.49 (m, 1H), 6.92 (d, J=7.7 Hz, 1H), 7.20 (s, 1H), 7.33 (d, J=7.7 Hz, 1H).

General Synthetic Methods

Compounds of formula (I) may be prepared according to the general synthetic methods described below. Ar$^1$—NH$_2$ as used in these methods may be formed as disclosed in, for example, Organic Letters, 2001, 3, 21, pp 3417-3419; J. Org. Chem., 2009, 74, pp 4634-4637; J. Org. Chem., 2000, 65, pp 2612-2614.

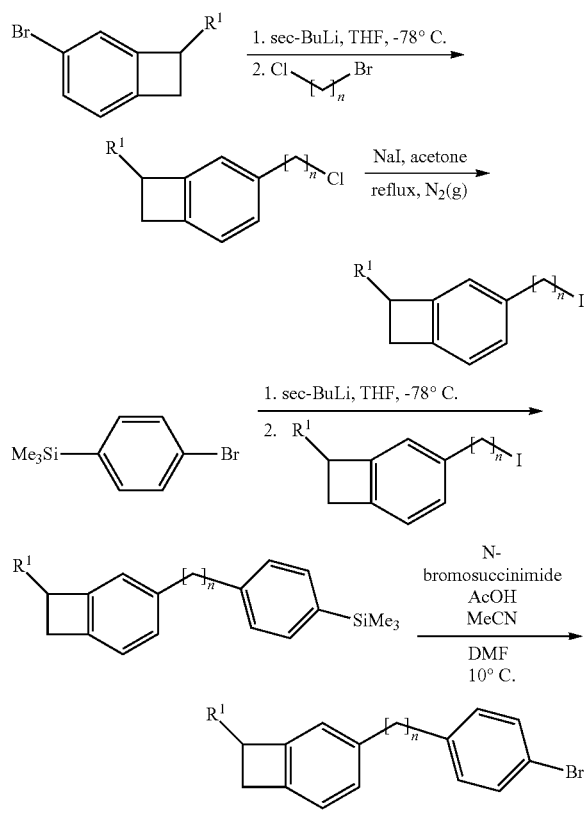

Intermediate 1 for forming a compound of formula (I) in which y=0 may be formed according to the following reaction scheme:

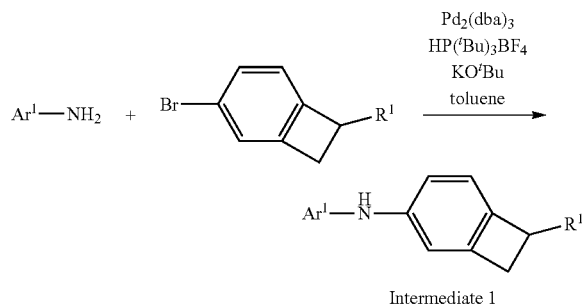

Intermediate 1

Intermediate 2 for forming a compound of formula (I) in which Ar$^3$ (in this case phenyl) is substituted with a group of formula (II) may be formed as per the following reaction scheme:

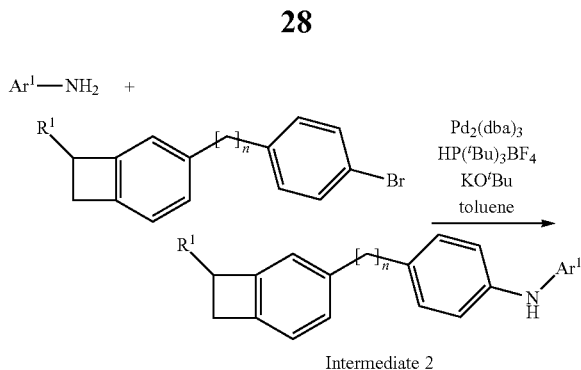

Intermediate 2

For groups R$^1$ that give higher benzocyclobutane reactivity (such as phenyl or alkoxy groups) it may be necessary to keep the reaction temperature for forming Intermediate 1 or Intermediate 2 below 60° C. to avoid ring opening of the cyclobutane ring.

Compounds of formula (I) may be synthesised by reaction of mono- or polyhalogenated Ar$^1$ with Intermediate 1 or Intermediate 2 according to the generic scheme below:

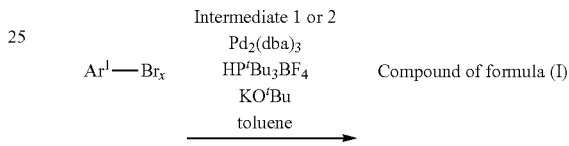

Polyhalogenated groups of formula (I) may be prepared as described below:

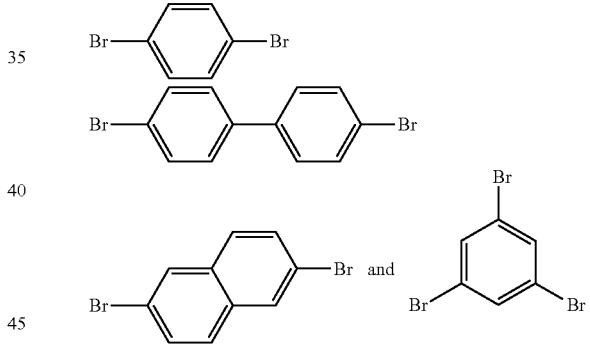

are commercially available, for example from Sigma Aldrich

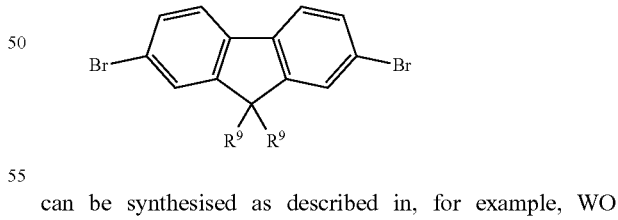

can be synthesised as described in, for example, WO 00/53656.

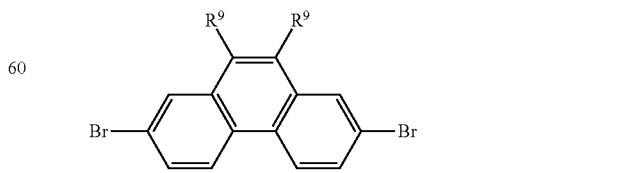

can be synthesised by routes disclosed in WO2005104264 and Organic Letters, 10(5), 773-776; 2008

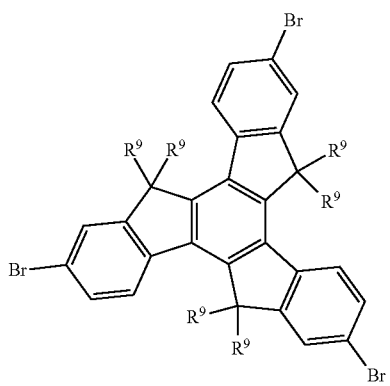

can be synthesised as described in J. AM. CHEM. SOC. 2003, 125, 9944-9945 (R9=alkyl)

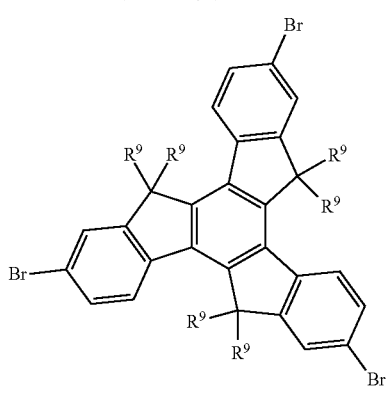

where one of $R^9$ is aryl can be synthesised by the procedure below:

a)

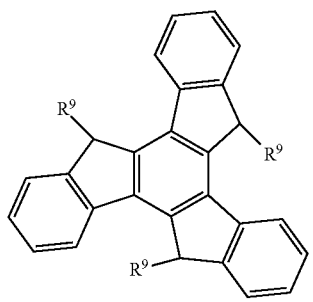

can be synthesised according to European Journal of Organic Chemistry, (19), 4127-4140; 2005, where $R^9$=aryl.

b)

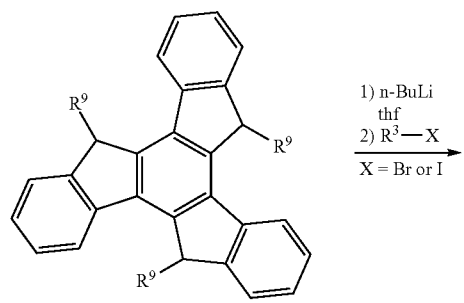

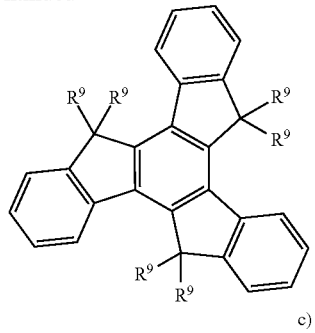

c)

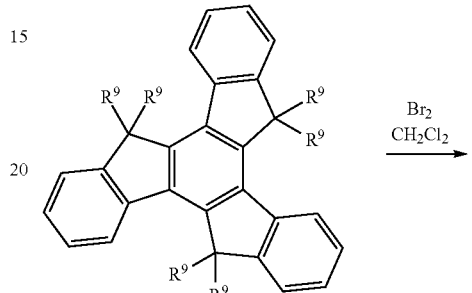

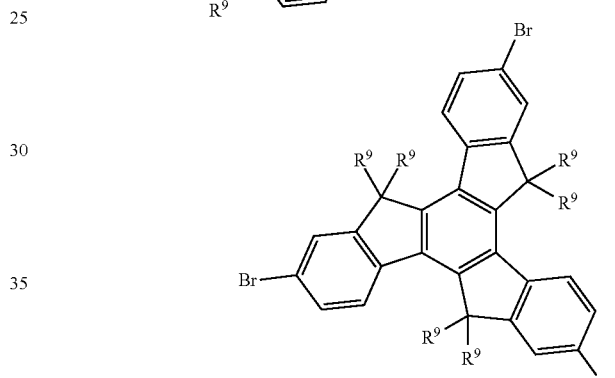

Mono amines can be synthesised by the reaction Intermediate 1 or 2 with a primary aryl amine

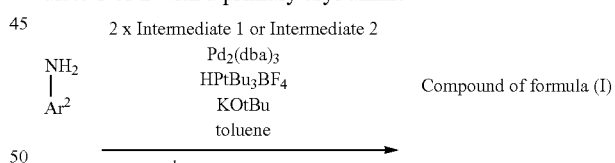

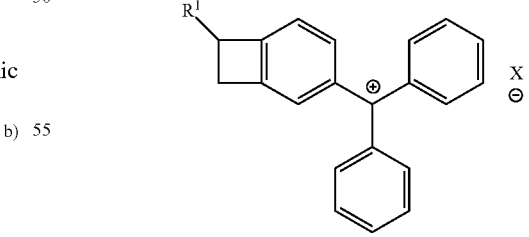

can be synthesised by a procedure analogous to that described in WO2009158069, starting from R1-substituted bromo-benzocyclobutane as described above.

A compound of formula (I) having a triazine Core may be formed according to the following reaction scheme, wherein tris(4-bromophenyl)triazine is formed as described in Chemistry Letters, (7), 545-546; 1999 or WO 2010/084977.

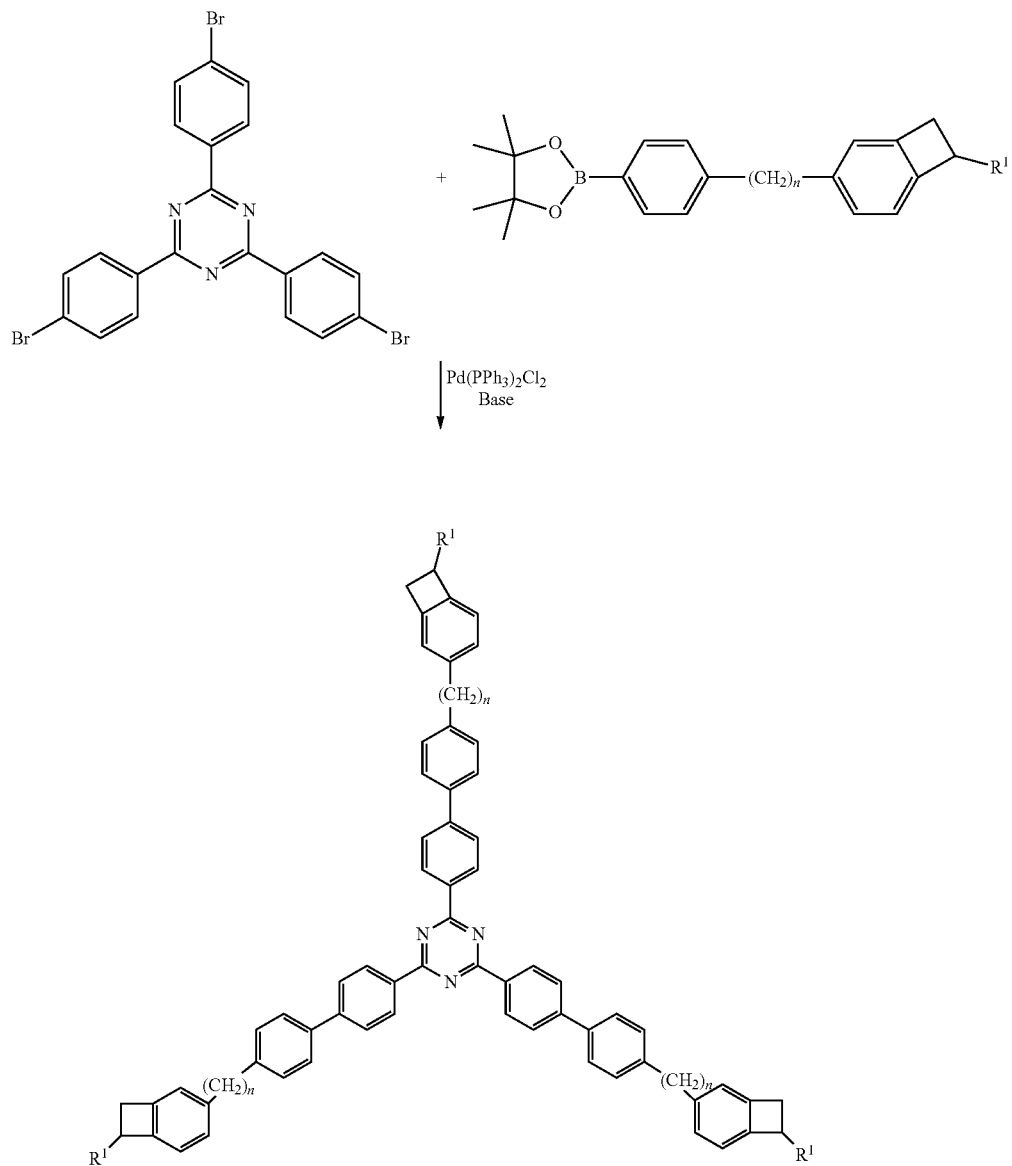
Co-Reactant
An exemplary co-reactant may be formed according to the following reaction scheme:
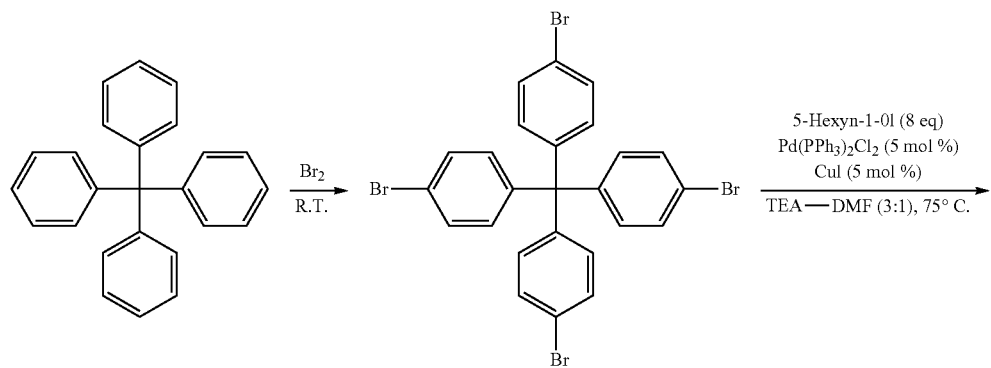

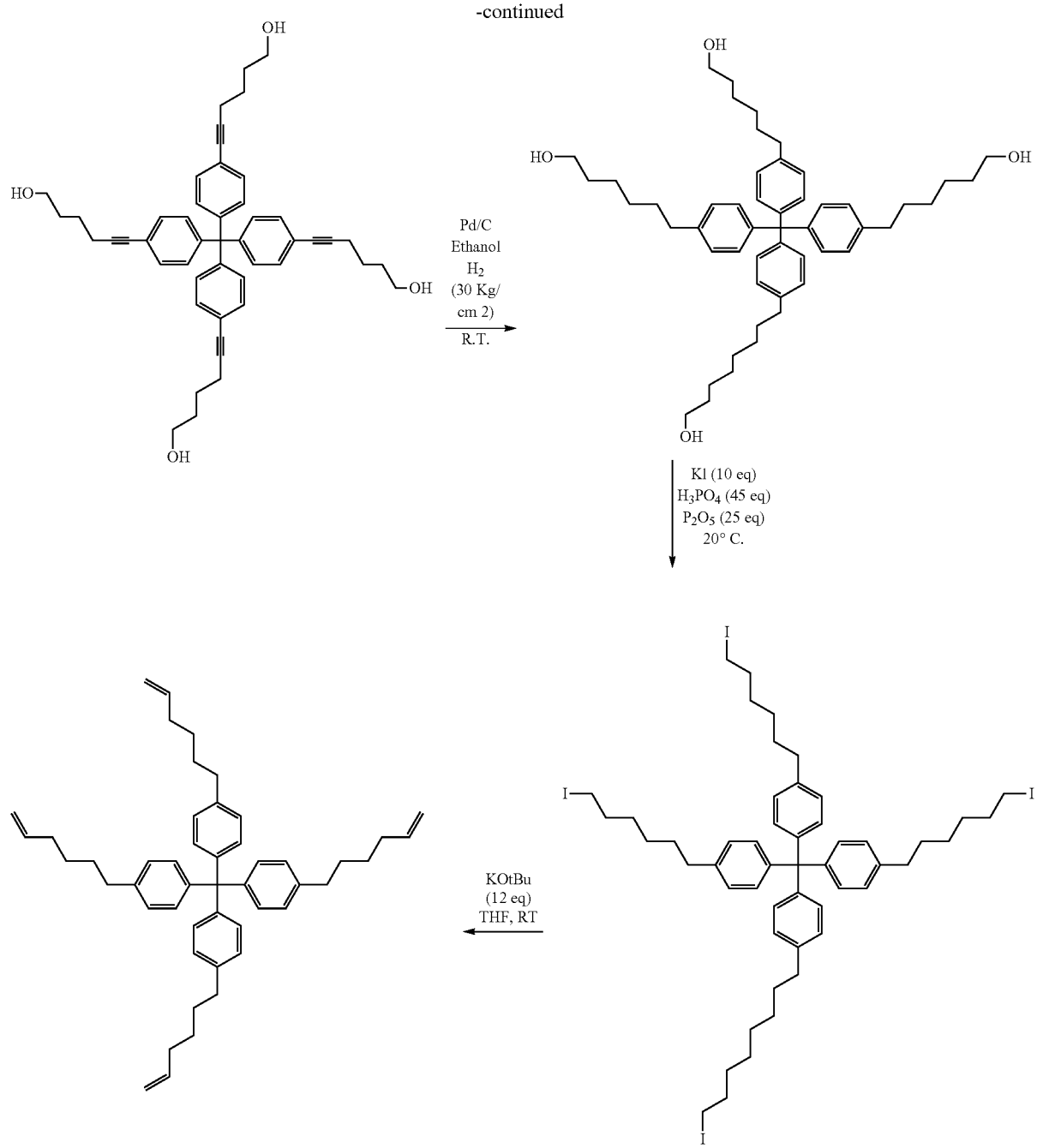
Model Compound Synthesis
Model compounds 5a-5c were prepared according to the following reaction scheme in order to show the effect of a range of substituents R[1] on reactivity of benzocyclobutane, wherein R[1] is an optionally substituted phenyl group Ar[6]:
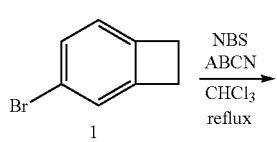
-continued
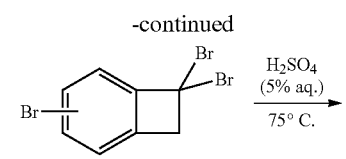
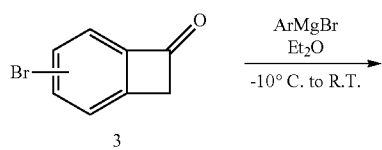

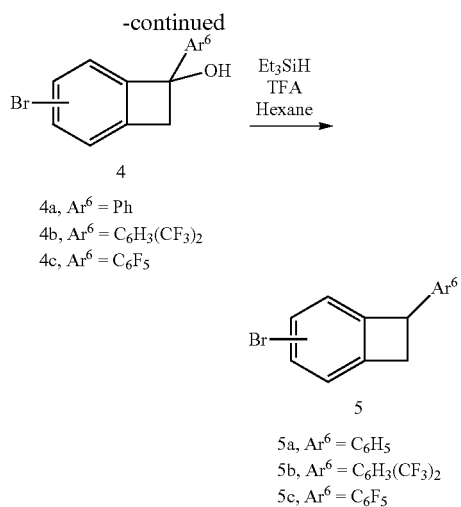

4a, Ar⁶ = Ph
4b, Ar⁶ = C₆H₃(CF₃)₂
4c, Ar⁶ = C₆F₅

5a, Ar⁶ = C₆H₅
5b, Ar⁶ = C₆H₃(CF₃)₂
5c, Ar⁶ = C₆F₅

3-Bromo-7,7-dibromo-bicyclo[4.2.0]octa-1,3,5-triene (2)

To a suspension of 3-bromobicyclo[4.2.0]octa-1,3,5-triene (1) (100.0 g, 0.546 mol) in chloroform (2000 ml) at room temperature was added N-bromosuccinimide (233.4 g, 1.311 mol) followed by 1,1'-Azobis(cyanocyclohexane) (ABCN) (13.3 g, 0.054 mol). The mixture was refluxed over night.

The reaction mixture was cooled to room temperature and quenched with H₂O (500 ml). The phases were separated, organic extract was washed with H₂O (3×500 ml), dried over MgSO₄ and concentrated under reduce pressure to yield 250 g of an orange oil. The oil was filtered through a plug (silica, 90% hexane:dichloromethane) to yield 3-bromo-7,7-dibromo-bicyclo[4.2.0]octa-1,3,5-triene (2) as a pale yellow oil (178 g, GC-MS: M³⁺=337, M⁺=339, M⁻=441, M³⁻=443, main isomer in a mixture with 3-bromo-7-bromobicyclo[4.2.0]octa-1,3,5-triene and 3-bromo-7,7,8-tribromo-bicyclo[4.2.0]octa-1,3,5-triene), which was used without further purification in the next step.

3-Bromobicyclo[4.2.0]octa-1,3,5-triene-7-one (3)

To a suspension of 3-bromo-7,7-dibromo-bicyclo[4.2.0]octa-1,3,5-triene (2) (186.2 g, 0.546 mol, theoretical) in H₂O (1000 ml) was added sulfuric acid (97%, 50 ml) at 15° C. The resulting mixture was stirred at 75° C. for 4.5 days.

The reaction mixture was cooled to room temperature was extracted with hexane (3×400 ml), the combined organic extracts were washed with NaOAc (3 wt % aq., 300 ml) and H₂O (2×300 ml), dried over MgSO₄ and concentrated under reduce pressure to give a yellow oil. The oil was filtered through a plug (silica, gradient of hexane:dichloromethane) to yield 3-Bromobicyclo[4.2.0]octa-1,3,5-triene-7-one (3) as a pale yellow oil (55.7 g, GC-MS: M⁺=196, M⁻=198, 51% yield, isolated as a mixture of isomers).

¹H NMR (600 MHz, CDCl₃): δ=3.99 (s, 2H), 7.22 (d, J=8.0 Hz, 1H), 7.58 (d, J=8.0 Hz, 1H), 7.72 (s, 1H).

General method for the synthesis of 3-Bromo-7-aryl-bicyclo[4.2.0]octa-1,3,5-triene (5)

3-Bromo-7-aryl-bicyclo[4.2.0]octa-1,3,5-triene-7-ol (4)

To a solution of 3-bromobicyclo[4.2.0]octa-1,3,5-triene-7-one (3) (2.0 g, 10.1 mmol) in diethyl ether (20 ml) at −10° C. was added the aryl Grignard. The resulting mixture was stirred at room temperature for 1 hr and quenched with HCl (2M aq., 10 ml) at 0° C. Phases were separated, organic extract was washed with H₂O (3×20 ml), dried over MgSO₄ and concentrated under reduce pressure. The residue was filtered through a plug (silica, gradient of hexane:dichloromethane) to yield 3-bromo-7-aryl-bicyclo[4.2.0]octa-1,3,5-triene-7-ol (4) as a mixture of isomers.

3-Bromo-7-aryl-bicyclo[4.2.0]octa-1,3,5-triene (5)

To a suspension of 3-bromo-7-aryl-bicyclo[4.2.0]octa-1,3,5-triene-7-ol (4) (1 eq.) in hexane at 0° C. was added triethylsilane (1.5 eq.) followed by trifluoro acetic acid (5 eq.). The resulting mixture was stirred at room temperature for 1 hr and poured into ice/water (20 ml). Phases were separated, organic extract was washed with NaOAc (10 wt % aq., 20 ml), H₂O (4×20 ml), dried over MgSO₄ and concentrated under reduce pressure. The residue was filtered through a plug (silica, hexane) to yield 3-bromo-7-aryl-bicyclo[4.2.0]octa-1,3,5-triene (5) as a mixture of isomers.

Specific Materials

3-Bromo-7-phenyl-bicyclo[4.2.0]octa-1,3,5-triene-7-ol (4a)

Using 3-Bromobicyclo[4.2.0]octa-1,3,5-triene-7-one (3) (2.0 g, 10.1 mmol), diethyl ether (20 ml), phenyl magnesium bromide (3M in diethyl ether, 3.4 ml, 10.1 mmol) afforded 3-Bromo-7-phenyl-bicyclo[4.2.0]octa-1,3,5-triene-7-ol (4a) as a pale yellow oil (2.1 g, GC-MS: M⁺=274, M⁻=276, 75% yield, isolated as a mixture of isomers).

¹H NMR (600 MHz, CDCl₃): δ=2.65 (s, 1H), 3.57 (d, J=14.3 Hz, 1H), 3.64 (d, J=14.3 Hz, 1H), 7.16 (d, J=7.9 Hz, 1H), 7.30 (m, 1H), 7.35 (m, 2H), 7.40 (s, 1H), 7.45 (d, J=8.8 Hz, 2H), 7.47 (d, J=7.8 Hz, 1H).

3-Bromo-7-(3',5'-bis(trifluoromethyl)benzyl)-bicyclo[4.2.0]octa-1,3,5-triene-7-ol (4b)

3,5-bis(trifluoromethyl)phenyl magnesium bromide was prepared from 3,5-bis(trifluoromethyl)-bromobenzene (3.27 g, 11.7 mmol) in solution in diethyl ether (3.8 ml). It was added to magnesium turning (0.30 g, 12.2 mmol) and a catalytic amount of iodine. It was refluxed for 1 hr, cooled down to room temperature and used as such.

Using 3-bromobicyclo[4.2.0]octa-1,3,5-triene-7-one (3) (2.0 g, 0.015 mol), diethyl ether (20 ml), 3,5-bis(trifluoromethyl)phenyl magnesium bromide (3M in diethyl ether, 3.8 ml, 11.7 mmol) afforded 3-Bromo-7-(3',5'-bis(trifluoromethyl)benzyl)-bicyclo[4.2.0]octa-1,3,5-triene-7-ol (4b) (3.17 g, GC-MS: M⁺=410, M⁻=412, 76% yield, isolated as a mixture of isomers).

3-Bromo-7-pentafluoro phenyl-bicyclo[4.2.0]octa-1,3,5-triene-7-ol (4c)

Pentafluorophenyl magnesium bromide was prepared from bromopentafluorobenzene (2.88 g, 11.7 mmol) in solution in diethyl ether (12 ml). It was added to magnesium turning (0.30 g, 12.2 mmol) and catalytic amount of iodine. It was refluxed for 1 hr, cooled down to room temperature and used as such.

Using 3-bromobicyclo[4.2.0]octa-1,3,5-triene-7-one (3) (2.0 g, 0.015 mol), diethyl ether (10 ml), pentafluorophenyl magnesium bromide (1M in diethyl ether, 12 ml, 11.7 mmol) afforded 3-Bromo-7-pentafluoro phenyl-bicyclo[4.2.0]octa-1,3,5-triene-7-ol (4c) as an oil (3.2 g, GC-MS: M$^+$=364, M$^-$=366, 86% yield, isolated as a mixture of isomers).

3-Bromo-7-phenyl-bicyclo[4.2.0]octa-1,3,5-triene (5a)

Using 3-bromo-7-phenyl-bicyclo[4.2.0]octa-1,3,5-triene-7-ol (4a) (2.1 g, 7.6 mmol), hexane (10 ml), triethylsilane (1.3 g, 11.5 mmol), trifluoro acetic acid (4.3 g, 38.2 mmol) afforded 3-Bromo-7-phenyl-bicyclo[4.2.0]octa-1,3,5-triene (5a) as a pale yellow oil (1.5 g, GC-MS: M$^+$=258, M$^-$=260, 76% yield, isolated as a mixture of isomers).

$^1$H NMR (600 MHz, CDCl$_3$): δ=3.06 (dd, J=14.2 Hz, 1.8 Hz, 1H), 3.71 (dd, J=14.2 Hz, 5.6 Hz, 1H), 4.62 (m, 1H), 7.03 (d, J=7.7 Hz, 1H), 7.23 (m, 3H), 7.31 (m, 3H), 7.42 (d, J=7.8 Hz, 1H).

3-Bromo-7-(3',5'-bis(trifluoromethyl)benzyl)-bicyclo[4.2.0]octa-1,3,5-triene (5b)

Using 3-Bromo-7-(3',5'-bis(trifluoromethyl)benzyl)-bicyclo[4.2.0]octa-1,3,5-triene (4b) (3.2 g, 7.7 mmol), hexane (10 ml), triethylsilane (1.3 g, 11.5 mmol), trifluoro acetic acid (4.4 g, 38.6 mmol) afforded 3-Bromo-7-(3',5'-bis(trifluoromethyl)benzyl)-bicyclo[4.2.0]octa-1,3,5-triene (5b) (0.8 g, GC-MS: M$^+$=394, M$^-$=396, 26% yield, isolated as a mixture of isomers).

$^1$H NMR (600 MHz, CDCl$_3$): δ=3.11 (dd, J=14.3 Hz, 2.5 Hz, 1H), 3.81 (dd, J=14.3 Hz, 5.7 Hz, 1H), 4.72 (m, 1H), 7.05 (d, J=7.9 Hz, 1H), 7.36 (s, 1H), 7.48 (d, J=7.8 Hz, 1H), 7.66 (s, 2H), 7.76 (s, 1H).

3-Bromo-7-pentafluoro phenyl-bicyclo[4.2.0]octa-1,3,5-triene (5c)

Using 3-Bromo-7-pentafluoro phenyl-bicyclo[4.2.0]octa-1,3,5-triene-7-ol (4c) (3.1 g, 8.5 mmol), hexane (15 ml), triethylsilane (1.08 g, 9.34 mmol), trifluoro acetic acid (9.7 g, 84.9 mmol) afforded 3-Bromo-7-pentafluoro phenyl-bicyclo[4.2.0]octa-1,3,5-triene (5c) (2.7 g, GC-MS: M$^+$=348, M$^-$=351, 73% yield, isolated as a mixture of isomers).

$^1$H NMR (600 MHz, CDCl$_3$): δ=3.43 (dd, J=14.3 Hz, 2.8 Hz, 1H), 3.76 (dd, J=14.3 Hz, 5.7 Hz, 1H), 4.86 (m, 1H), 6.99 (d, J=7.9 Hz, 1H), 7.30 (s, 1H), 7.41 (d, J=7.8 Hz, 1H).

Reactivity of Model Compounds

The relative reactivity of the model compounds in a Diels-Alder-type reaction with compound 6 in the following reaction scheme below was determined:

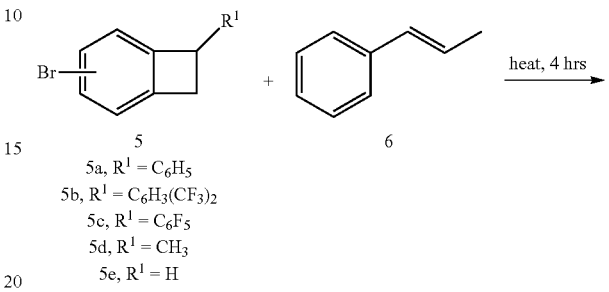

5a, R$^1$ = C$_6$H$_5$
5b, R$^1$ = C$_6$H$_3$(CF$_3$)$_2$
5c, R$^1$ = C$_6$F$_5$
5d, R$^1$ = CH$_3$
5e, R$^1$ = H

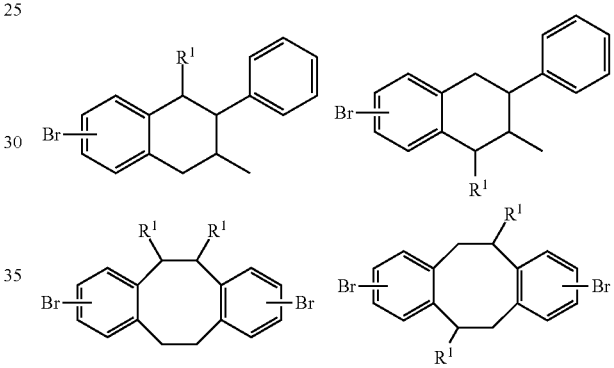

The reactions were carried out by mixing the model compound (0.1 mmol) and trans-beta-methylstyrene (0.1 mmol, 0.118 g, Compound 6). The reaction mixture was stirred at the temperature given in the table below for 4 hrs under a nitrogen atmosphere.

Relative reactivity was measured by measuring the percentage of the reacted model compound by GC-MS.

| Name | 5a (R = C$_6$H$_5$) | 5b (R = C$_6$H$_3$(CF$_3$)$_2$) | 5c (R = C$_6$F$_5$) | 5d (R = CH$_3$) | 5e (R = H) |
|---|---|---|---|---|---|
| Structure | 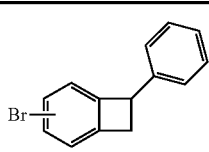 | 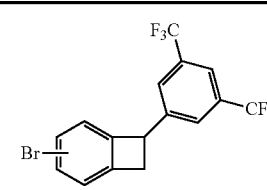 | 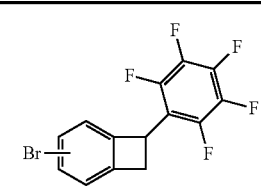 | 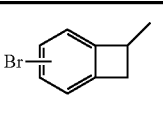 | 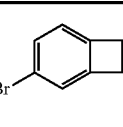 |
| 160° C. | 100% | — | — | 13.4-15.1% | 0.5-0.6% |
| 140° C. | 100% | 91% | 76% | 1.6% | — |
| 120° C. | 65% | — | 29% | — | — |

Results at 160° C. show that substituted model compounds 5a and 5d are more reactive than unsubstituted model compound 5e.

Results at lower temperatures show particularly high reactivity of substituted model compounds, in particular for model compounds substituted by phenyl (including both unsubstituted and substituted phenyl).

Device Example

A device having the following structure was prepared: ITO/HIL/HTL/LEL/Cathode
wherein ITO is an indium-tin oxide cathode; HIL is a hole-injection layer; HTL is a hole-transporting layer; and LEL is a light-emitting layer.

The hole injection layer was formed by spin-coating a layer of a conductive hole-injection material. The hole-transporting layer was formed by spin-coating a compound of formula (I) from solution. The layer was heated on a hotplate to react the compound of formula (I). The light-emitting layer was formed by spin-coating a fluorescent polyfluorene on the hole-transporting layer. The cathode was formed by evaporation of a first layer of a metal fluoride, a second layer of aluminium and a third layer of silver.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A method of forming a layer of an electronic device, the method comprising the step of depositing a precursor layer comprising a compound of formula (I) and reacting the compound of formula (I) in a ring-opening addition reaction:

wherein Core is a non-polymeric core group; and each Reactive Group, which is the same or different in each occurrence, is a group of formula (II):

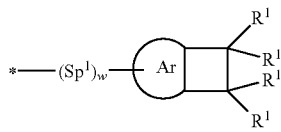

wherein:
Sp$^1$ independently in each occurrence represents a spacer group;
w independently in each occurrence is 0 or 1;
Ar in each occurrence independently represents an aryl or heteroaryl group that is unsubstituted or is substituted with one or more substituents;
R$^1$ in each occurrence independently represents H or a substituent, with the proviso that at least one R$^1$ is selected from the group consisting of linear or branched C$_{1-20}$ alkyl; C$_{1-20}$ alkoxy; aryl or heteroaryl that is unsubstituted or is substituted with one or more C$_{1-10}$ alkyl groups; and silyl;
n is at least 1; and
* is a point of attachment of the group of formula (II) to Core;
and wherein the compound of formula (I) reacts with itself or with a non-polymeric co-reactant.

2. A method according to claim 1 wherein w of at least one group of formula (II) is 1, and Sp$^1$ is a C$_{1-20}$ n-alkyl chain wherein one or more non-adjacent C atoms of the n-alkyl chain are optionally replaced with optionally substituted aryl or heteroaryl, O, S, substituted N, substituted Si—C═O or —COO—, and one or more H atoms of the n-alkyl chain are optionally replaced with C$_{1-5}$ alkyl, F or an aryl or heteroaryl group.

3. A method according to claim 1 wherein at least one group of formula (II) carries only one R$^1$ substituent group.

4. A method according to claim 1 wherein Ar is phenyl that is unsubstituted or is substituted with one or more substituents.

5. A method according to claim 1 wherein Core is a group of formula (III):

wherein:
Ar$^1$ in each occurrence independently represents an aryl or heteroaryl group that is unsubstituted or is substituted with one or more substituents;
Ar$^3$ in each occurrence independently represents an aryl or heteroaryl group that is unsubstituted or is substituted with one or more substituents;
R$^8$ in each occurrence independently represents a substituent, and R$^8$ and Ar$^3$ directly attached to the same N atom are optionally linked to form a ring;
x is a positive integer;
y in each occurrence is independently 0 or a positive integer;
m in each occurrence is a positive integer;
and wherein the or each group of formula (II) is independently in each occurrence bound to one of: Ar$^1$; Ar$^3$ in the case where y is a positive integer; and N in the case where y is 0.

6. A method according to claim 5 wherein R$^8$ is a group of formula (II).

7. A method according to claim 5 or 6 wherein Ar$^1$ is selected from the group consisting of phenyl that is unsubstituted or is substituted with one or more substituents, and a fused aryl or heteroaryl group that is unsubstituted or is substituted with one or more substituents.

8. A method according to claim 5 wherein Ar$^1$ is selected from groups of formulae (IV)-(IX), each of which is unsubstituted or is substituted with one or more substituents:

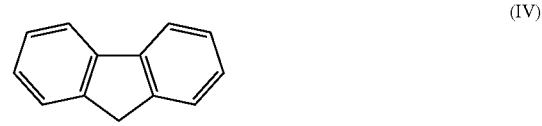

-continued (VI)
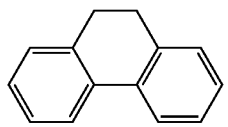

(VII)
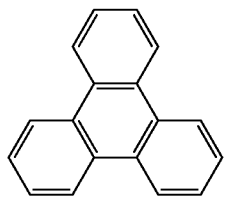

(VIII)
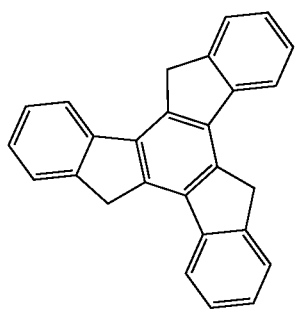

(IX)
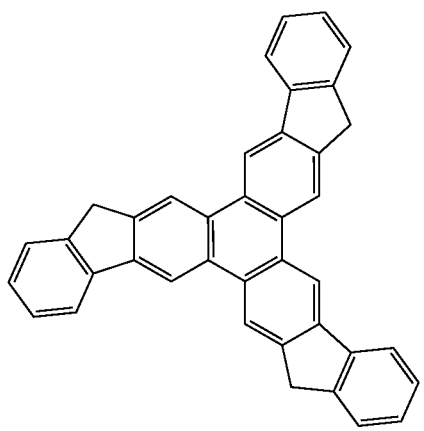

9. A method according to claim 1 wherein the compound of formula (I) is an ionic compound and Core is a cation or anion.

10. A method according to claim 9 wherein the compound of formula (I) is an optionally substituted compound of formula (Id):

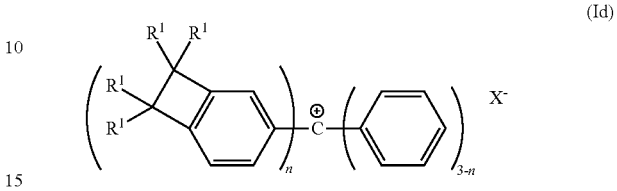

(Id)

wherein $X^-$ is an anion.

11. A method according to claim 1 wherein the compound of formula (I) is reacted with itself to form the layer.

12. A method according to claim 1 wherein the compound of formula (I) is reacted with a dienophile co-reactant of formula (X):

(X)

wherein:
Core, $Sp^1$ and w are as defined in claim 1;
$R^7$ is H or a substituent;
$R^6$ is H or a substituent; and
q is at least 1.

13. A method according to claim 1 wherein the electronic device is an organic light-emitting device comprising a light-emitting layer between an anode and a cathode, and wherein the reacted layer is a hole-transporting layer between the anode and the light-emitting layer.

14. A method according to claim 5 wherein x is 1, 2, or 3.

15. A method according to claim 5 wherein y in each occurrence is independently 0, 1, or 2.

16. A method according to claim 5 wherein m in each occurrence is 1 or 2.

* * * * *